US010573659B2

(12) United States Patent
Oh et al.

(10) Patent No.: US 10,573,659 B2
(45) Date of Patent: Feb. 25, 2020

(54) SEMICONDUCTOR MEMORY DEVICE OF THREE-DIMENSIONAL STRUCTURE

(71) Applicant: SK hynix Inc., Gyeonggi-do (KR)

(72) Inventors: Sung-Lae Oh, Chungcheongbuk-do (KR); Dong-Hyuk Kim, Seoul (KR); Soo-Nam Jung, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/915,136

(22) Filed: Mar. 8, 2018

(65) Prior Publication Data

US 2019/0115357 A1 Apr. 18, 2019

(30) Foreign Application Priority Data

Oct. 16, 2017 (KR) ........................ 10-2017-0134075

(51) Int. Cl.
*H01L 27/11578* (2017.01)
*H01L 27/11582* (2017.01)
*H01L 27/11526* (2017.01)
*H01L 27/11521* (2017.01)
*H01L 23/528* (2006.01)
(Continued)

(52) U.S. Cl.
CPC ...... *H01L 27/11582* (2013.01); *H01L 23/528* (2013.01); *H01L 27/0207* (2013.01); *H01L 27/11521* (2013.01); *H01L 27/11526* (2013.01); *H01L 27/11556* (2013.01); *H01L 27/11568* (2013.01); *H01L 27/11573* (2013.01); *H01L 29/0649* (2013.01); *H01L 29/1037* (2013.01);
(Continued)

(58) Field of Classification Search
CPC .. G11C 5/06–10; G11C 11/5621–5642; G11C 16/0408–0458; G11C 16/0483; G11C 27/005; G11C 5/14–148; H01L 2924/1438; H01L 29/42324–29/42336; H01L 29/788–7889; H01L 27/11551–11556
See application file for complete search history.

(56) References Cited

U.S. PATENT DOCUMENTS 9,812,464 B1 * 11/2017 Hwang ............. H01L 27/11582
10,304,852 B1 * 5/2019 Cui .................... H01L 27/11582
(Continued)

FOREIGN PATENT DOCUMENTS

KR         100885920        2/2009
KR       1020180095173      8/2018

*Primary Examiner* — Jarrett J Stark
(74) *Attorney, Agent, or Firm* — IP & T Group LLP

(57) ABSTRACT

A semiconductor memory device includes a logic structure including a peripheral circuit element which is formed over a substrate, a bottom dielectric layer which covers the peripheral circuit element and a bottom wiring line which is disposed in the bottom dielectric layer and is coupled to the peripheral circuit element; a memory structure stacked over the logic structure in a first direction perpendicular to a top surface of the substrate; a bit line disposed over a first top dielectric layer which covers the memory structure, extending in a second direction parallel to the top surface of the substrate, and divided into first and second bit line sections; and a power pad disposed over the first top dielectric layer between the first bit line section and the second bit line section, and coupled to the bottom wiring line through a power coupling contact which passes through the memory structure.

19 Claims, 12 Drawing Sheets

(51) Int. Cl.
| | |
|---|---|
| *H01L 27/11556* | (2017.01) |
| *H01L 29/06* | (2006.01) |
| *H01L 27/02* | (2006.01) |
| *H01L 27/11568* | (2017.01) |
| *H01L 27/11573* | (2017.01) |
| *H01L 29/10* | (2006.01) |
| H01L 27/11565 | (2017.01) |
| H01L 27/11519 | (2017.01) |

(52) U.S. Cl.
CPC ... *H01L 27/11519* (2013.01); *H01L 27/11565* (2013.01); *H01L 27/11578* (2013.01)

(56) References Cited

U.S. PATENT DOCUMENTS

| | | | |
|---|---|---|---|
| 10,319,635 B2* | 6/2019 | Nosho | H01L 21/76877 |
| 2016/0118399 A1* | 4/2016 | Son | G11C 5/025 |
| | | | 365/185.18 |
| 2017/0012052 A1* | 1/2017 | Jang | H01L 27/11582 |
| 2017/0047343 A1* | 2/2017 | Lee | H01L 27/1157 |
| 2017/0084696 A1* | 3/2017 | Lee | H01L 27/11565 |
| 2017/0179154 A1* | 6/2017 | Furihata | H01L 27/11524 |
| 2017/0358593 A1* | 12/2017 | Yu | H01L 23/5226 |
| 2018/0151587 A1* | 5/2018 | Son | G11C 13/0038 |
| 2019/0067316 A1* | 2/2019 | Oh | G11C 16/0483 |
| 2019/0164991 A1* | 5/2019 | Lim | H01L 27/11582 |

* cited by examiner

FIG.3
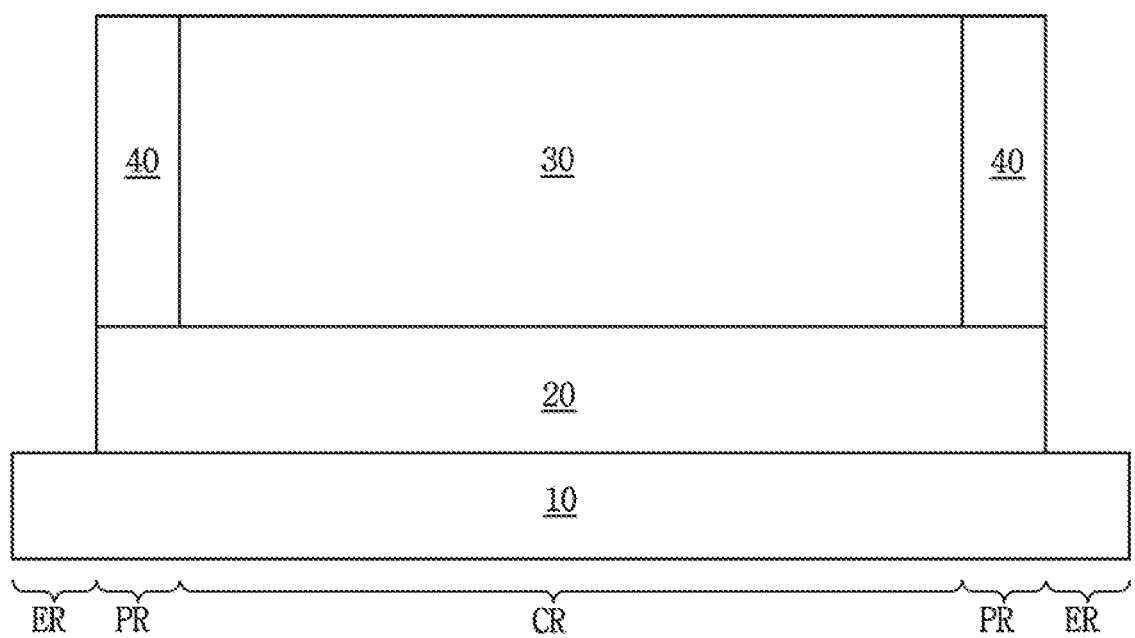
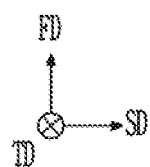

SEMICONDUCTOR MEMORY DEVICE OF THREE-DIMENSIONAL STRUCTURE

CROSS-REFERENCE TO RELATED APPLICATION

The present application claims priority to Korean Patent Application No. 10-2017-0134075 filed on Oct. 16, 2017, which is incorporated herein by reference in its entirety.

BACKGROUND

1. Technical Field

Various embodiments generally relate to a semiconductor memory device, and, more particularly, to a semiconductor memory device including a memory cell array of a three-dimensional structure.

2. Related Art

A semiconductor memory device employs various operating voltages, such as a power supply voltage, a ground voltage and a source voltage, to access data. In order to ensure the reliability of the semiconductor memory device, the operating voltages should be stably provided to the semiconductor memory device.

SUMMARY

In an embodiment, a semiconductor memory device may include: a logic structure including a peripheral circuit element which is formed over a substrate; a memory structure stacked over the logic structure in a first direction; a bit line disposed over a first top dielectric layer covering the memory structure, extending in a second direction parallel to the top surface of the substrate, and divided into a first bit line section and a second bit line section; and a power pad disposed over the first top dielectric layer between the first bit line section and the second bit line section, and coupled to the peripheral circuit element.

In an embodiment, a semiconductor memory device may include: a logic structure including a peripheral circuit element which is formed over a substrate; a memory structure stacked over the logic structure in a first direction, and including memory blocks and a dummy block which are arranged in a second direction; a plurality of bit lines disposed over a first top dielectric layer covering the memory structure, and each including a first bit line section and a second bit line section which extend in opposite directions from both ends of the dummy block when viewed in the second direction; and a power pad disposed over the first top dielectric layer between first bit line sections and second bit line sections of the bit lines, and coupled to the peripheral circuit element.

In an embodiment, a semiconductor memory device may include: a logic structure including a peripheral circuit element which is formed over a substrate; a semiconductor layer disposed over the logic structure; a plurality of memory blocks disposed over the semiconductor layer, each including a plurality of gate electrode layers and a plurality of first interlayer dielectric layers which are alternately stacked along a first direction that is perpendicular to a top surface of the substrate, and arranged along a second direction that is parallel to the top surface of the substrate; a plurality of dummy blocks disposed over the semiconductor layer to neighbor the memory blocks in the second direction, and each including a plurality of dummy gate electrode layers and a plurality of second interlayer dielectric layers which are alternately stacked along the first direction; a plurality of bit lines disposed over a first top dielectric layer which covers the memory blocks and the dummy blocks, extending in the second direction, and each divided into a first bit line section and a second bit line section over a corresponding dummy block among the dummy blocks; and power pads disposed over the first top dielectric layer between first bit line sections and second bit line sections of the bit lines, and coupled to the peripheral circuit element.

In an embodiment, A memory system includes: a semiconductor memory device, the semiconductor memory device comprising: a logic structure including a peripheral circuit element which is formed over a substrate; a memory structure stacked over the logic structure in a first direction; a bit line disposed over a first top dielectric layer covering the memory structure, extending in a second direction parallel to the top surface of the substrate, and divided into a first bit line section and a second bit line section; a power pad disposed over the first top dielectric layer between the first bit line section and the second bit line section, and coupled to the peripheral circuit element; and a controller operatively coupled to the semiconductor memory device for controlling the operations of the semiconductor memory device.

BRIEF DESCRIPTION OF THE DRAWINGS

FIG. 3 is a cross-sectional view schematically illustrating a representation of an example of the layout of a semiconductor memory device in accordance with an embodiment.

DETAILED DESCRIPTION

Hereinafter, a semiconductor memory device of a three-dimensional structure will be described below with reference to the accompanying drawings through various examples of embodiments.

Figure 1:
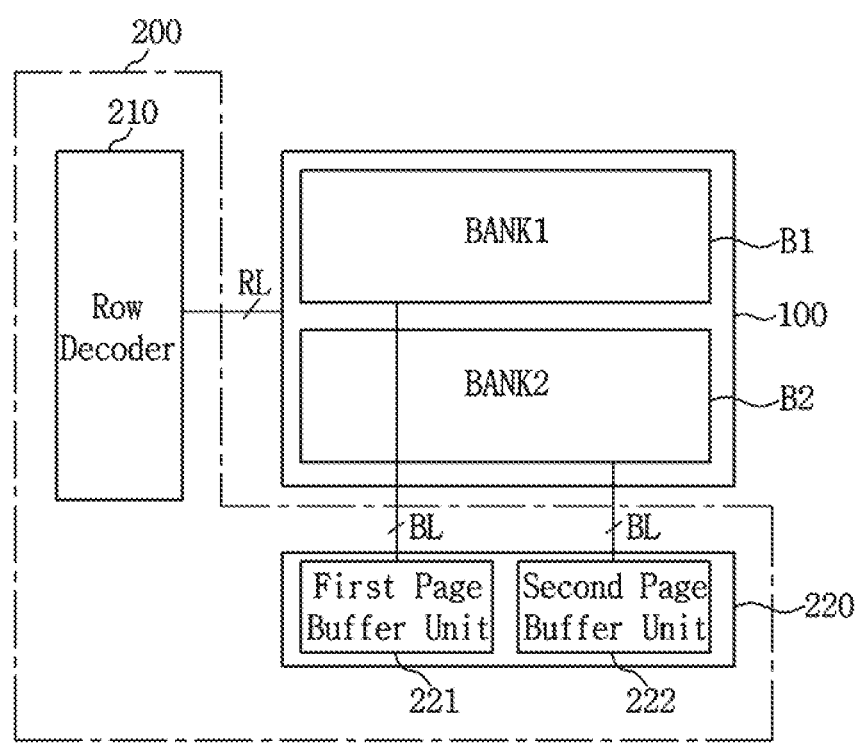
FIG. 1 is a block diagram illustrating a representation of an example of a memory device in accordance with an embodiment.

FIG. 1 is a block diagram illustrating a representation of an example of a memory device in accordance with an embodiment.

Referring to FIG. 1, the memory device in accordance with the embodiment may include a memory cell array 100 and a peripheral circuit 200. The peripheral circuit 200 may include a row decoder 210 and a page buffer circuit 220. While not shown, the peripheral circuit 200 may further include a control logic, a voltage generator, a column decoder and an input/output buffer.

According to an implementation of the embodiment shown in FIG. 1, the memory cell array 100 may include a first memory bank B1 and a second memory bank B2. The memory cell array 100 configured by the first and second memory banks B1 and B2 may be defined as one plane. However, it is noted that the invention is not limited in this way and two or more memory banks may be employed.

Each of the first and second memory banks B1 and B2 may include a plurality of memory blocks (not shown). Each of the memory blocks may be coupled to the row decoder 210 through row lines RL. The row lines RL may include at least one drain select line, a plurality of word lines and at least one source select line. The memory blocks may be coupled to the page buffer circuit 220 through bit lines BL.

Each of the memory blocks may include a plurality of cell strings. Each of the cell strings may include a drain select transistor, a plurality of memory cells and a source select transistor which are coupled in series between a corresponding bit line and a common source line. In an embodiment, the memory cells may be nonvolatile memory cells.

The row decoder 210 may transmit an operating voltage generated in the voltage generator, to memory cells selected according to a row address inputted from an exterior device. The exterior device may for example be a host device operatively coupled with the memory device.

The page buffer circuit 220 may be coupled to the memory cell array 100 through bit lines BL. In an embodiment, the page buffer circuit 220 may include a first page buffer unit 221 corresponding to the first memory bank B1 and a second page buffer unit 222 corresponding to the second memory bank B2. Each of the first page buffer unit 221 and the second page buffer unit 222 may include a plurality of page buffers. The page buffers may correspond to the bit lines BL, respectively. Each of the page buffers may be coupled to the memory cell array 100 through a corresponding bit line BL. The page buffers may temporarily store data to be stored in memory cells or sense the data stored in memory cells, depending on an operation mode. The page buffers may operate as a write driver circuit in a program operation mode, and as a sense amplifier circuit in a read operation mode.

The control logic may output a row address in an address received through the input/output buffer, to the row decoder 210, and output a column address to the column decoder. The control logic may control the page buffer circuit 220 and the voltage generator to access selected memory cells, in response to a command received through the input/output buffer.

The voltage generator may generate various voltages required in the memory device. For example, the voltage generator may generate a program voltage, a pass voltage, a select read voltage and an unselect read voltage.

The column decoder may input program data to the page buffer circuit 220 in response to a column address from the control logic.

Figure 2:
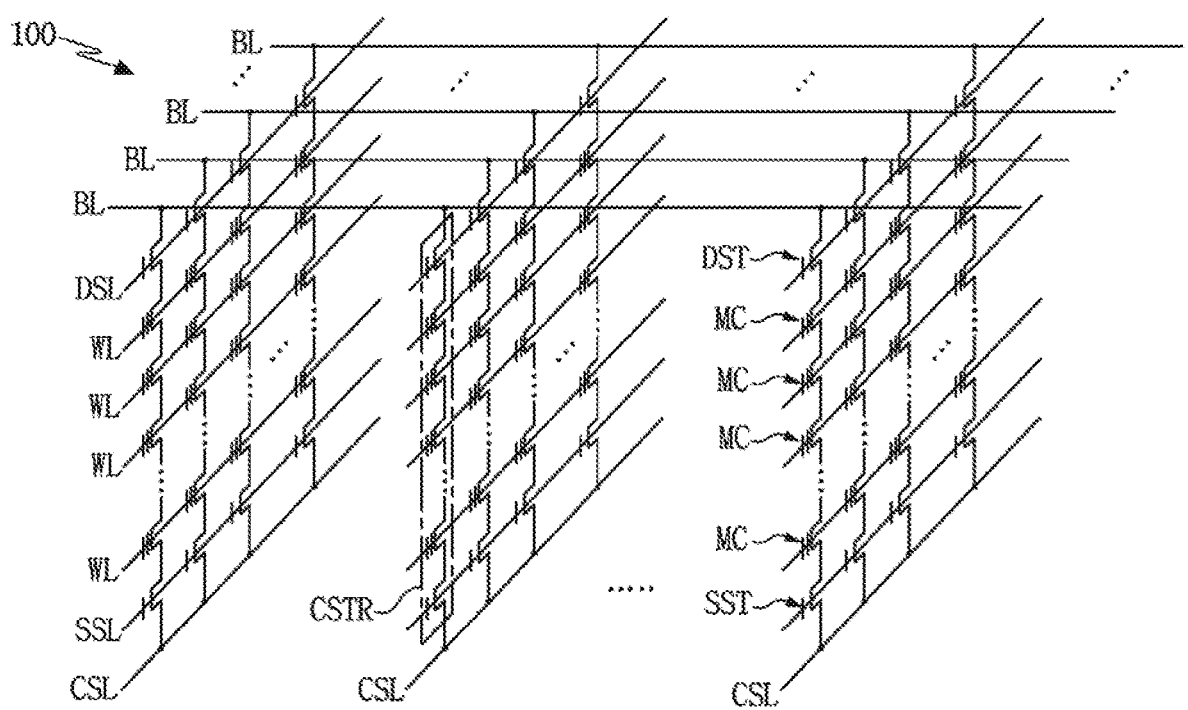
FIG. 2 is an equivalent circuit diagram illustrating a representation of an example of the memory cell array shown in FIG. 1.

FIG. 2 is an equivalent circuit diagram illustrating a representation of an example of the memory cell array shown in FIG. 1.

Referring to FIG. 2, the memory cell array 100 may include a plurality of cell strings CSTR which are coupled between a plurality of bit lines BL and a plurality of common source lines CSL.

A plurality of cell strings CSTR may be coupled in parallel to each of the bit lines BL. Each of the cell strings CSTR may include a drain select transistor DST, a plurality of memory cells MC and a source select transistor SST which are coupled in series between a corresponding bit line BL and a corresponding common source line CSL.

Source select lines SSL, a plurality of word lines WL and drain select lines DSL may be provided between the common source lines CSL and the bit lines BL. The gate terminal of the source select transistor SST may be coupled to a corresponding source select line SSL. The gate terminals of the memory cells MC may be coupled to corresponding word lines WL, respectively. The gate terminal of the drain select transistor DST may be coupled to a corresponding drain select line DSL.

The source terminal of the source select transistor SST may be coupled to a corresponding common source line CSL. The drain terminal of the source select transistor SST may be coupled to a lowermost memory cell MC. Meanwhile, the source terminal of the drain select transistor DST may be coupled to the drain terminal of an uppermost memory cell MC. The drain terminal of the drain select transistor DST may be coupled to a corresponding bit line BL.

While FIG. 2 illustrates a structure in which one drain select transistor DST and one source select transistor SST are included in each cell string CSTR, it is to be noted that the embodiment is not limited thereto and each cell string CSTR may include a plurality of drain select transistors DST or/and a plurality of source select transistors SST.

If a signal is applied to the gate terminal of the drain select transistor DST through the drain select line DSL, a signal applied through the bit line BL is transferred to the memory cells MC which are coupled in series, by which a data read or write operation may be performed. If a signal is applied to the gate terminal of the source select transistor SST through the source select line SSL, an erase operation of removing all the data stored in the memory cells MC may be performed.

Hereinbelow, in the accompanying drawings, a direction vertically projecting from the top surface of a substrate is defined as a first direction FD, and two directions parallel to the top surface of the substrate and intersecting with each other are defined as a second direction SD and a third direction TD, respectively. The second direction SD may correspond to the extending direction of bit lines, and the third direction TD may correspond to the extending direction of the row lines. The second direction SD and the third direction TD may intersect substantially perpendicularly with each other. In the drawings, a direction indicated by an arrow and a direction opposite thereto represent the same direction.

FIG. 3 is a cross-sectional view schematically illustrating a representation of an example of the layout of a semiconductor memory device in accordance with an embodiment.

Referring to FIG. 3, a logic structure 20 may be disposed on a substrate 10, and a memory structure 30 may be disposed on the logic structure 20. The logic structure 20 may include the peripheral circuit 200 of FIG. 1. The memory structure 30 may include the memory cell array 100 of FIG. 1. The semiconductor memory device in accordance with the embodiment may have a PUC (peri under cell) structure.

The substrate 10 may include a circuit region CR, coupling regions PR and edge regions ER. The coupling regions PR may be disposed adjacent to both ends of the circuit region CR in the second direction SD. The edge regions ER may be disposed in the peripheries of the substrate 10 and adjacent to the coupling regions PR in the second direction SD.

The logic structure 20 and the memory structure 30 may be stacked on the substrate 10 in the circuit region CR. The logic structure 20 may also extend to the coupling regions PR. For example, one part of peripheral circuit elements configuring the logic structure 20 may be disposed in the circuit region CR, and another part may be disposed in the coupling regions PR.

Coupling structures 40 may be disposed on the memory structure 20 which is disposed in the coupling regions PR. According to another embodiment, unlike the illustration of FIG. 3, a coupling structure 40 may be disposed in the circuit region CR.

Figure 4:
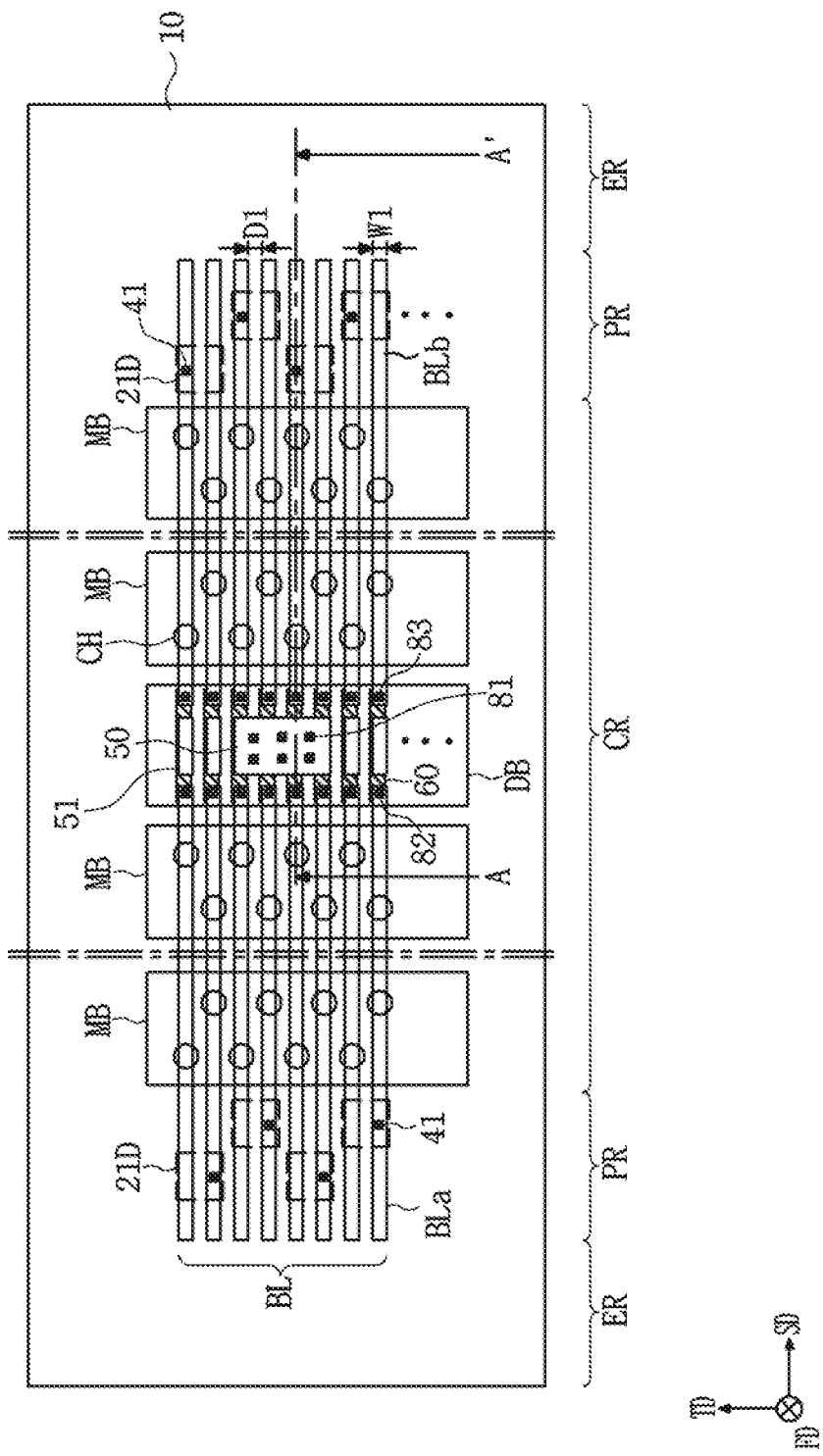
FIG. 4 is a top view illustrating a representation of an example of a semiconductor memory device in accordance with an embodiment.
Figure 5:
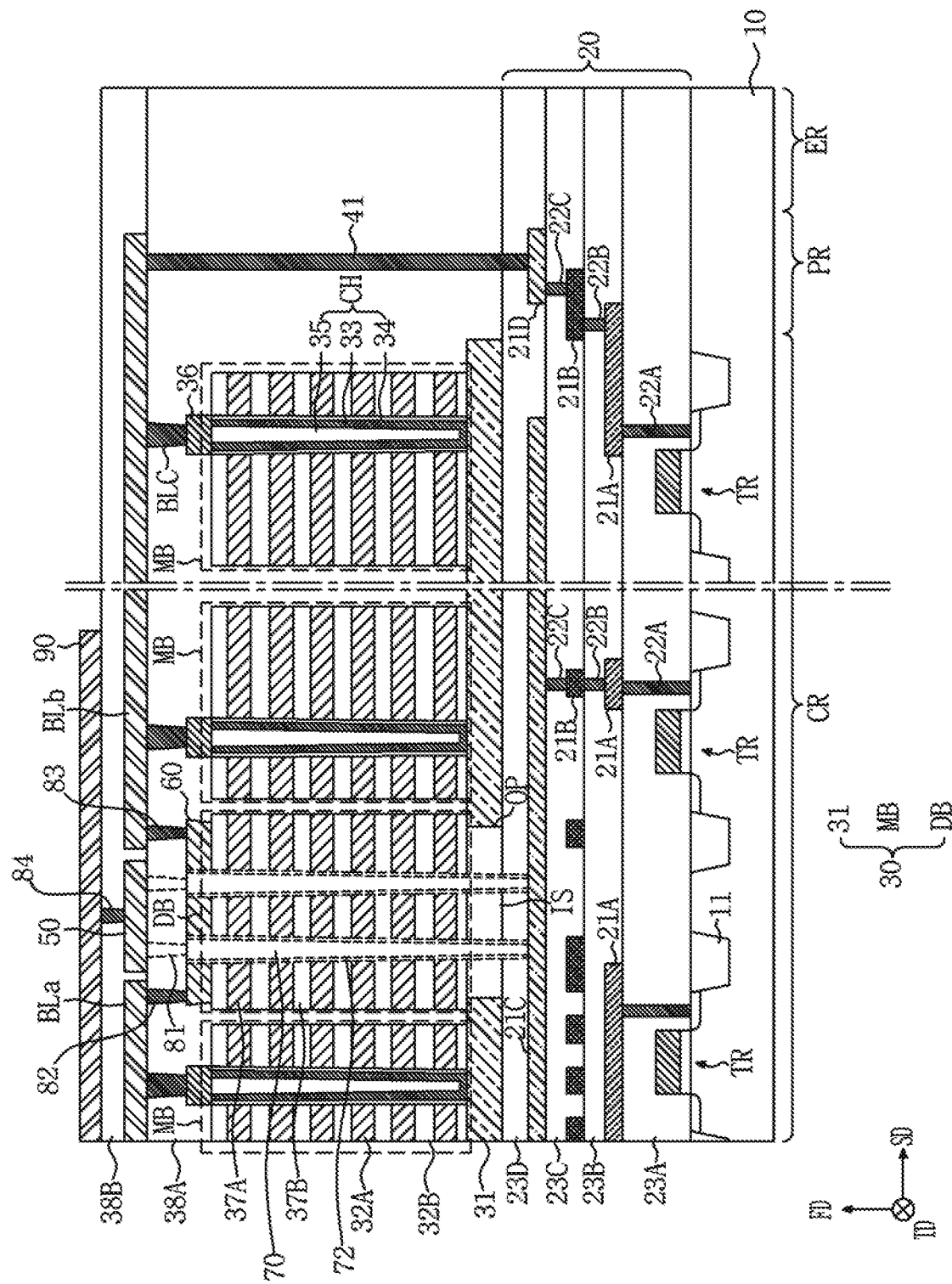
FIG. 5 is a cross-sectional view taken along the line A-A' of FIG. 4.

FIG. 4 is a top view illustrating a representation of an example of a semiconductor memory device in accordance with an embodiment, and FIG. 5 is a cross-sectional view corresponding to the line A-A' of FIG. 4.

Referring to FIGS. 4 and 5, a substrate 10 including a circuit region CR, coupling regions PR and edge regions ER may be provided. The coupling regions PR may be disposed adjacent to both ends of the circuit region CR in the second direction SD. The edge regions ER may be disposed adjacent to the coupling regions PR in the second direction SD at the peripheries of the substrate 10.

The substrate 10 may include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer. A logic structure 20 and a memory structure 30 may be disposed by being sequentially stacked in the circuit region CR of the substrate 10. The memory structure 30 may include a semiconductor layer 31, memory blocks MB and a dummy block DB.

The logic structure 20 may include a peripheral circuit (see 200 of FIG. 1). The peripheral circuit may be configured by peripheral circuit elements such as logic transistors TR, resistors, capacitors and fuses. The peripheral circuit elements may be integrated in the substrate 10 of the circuit region CR.

The logic transistors TR may be disposed in the active region of the substrate 10 which is defined by an isolation layer 11. In an embodiment, the logic transistors TR may configure a page buffer circuit (see 220 of FIG. 1). In another embodiment, the logic transistors TR may be source pickup transistors.

The logic structure 20 may include coupling pads 21D which are electrically coupled with the logic transistors TR configuring the page buffer circuit. The coupling pads 21D may be disposed in the coupling regions PR. The logic structure 20 may include bottom wiring lines 21A, 21B and 21C and bottom contacts 22A, 22B and 22C which are electrically coupled with the logic transistors TR, and bottom dielectric layers 23A, 23B, 23C and 23D which cover the bottom wiring lines 21A, 21B and 21C, the bottom contacts 22A, 22B and 22C and the coupling pads 21D. More specifically, the bottom dielectric layer 23A covers side surfaces of the bottom contacts 22A, the bottom dielectric layer 23B covers top surfaces and side surfaces of the bottom wiring lines 21A and side surfaces of the bottom contacts 22B, the bottom dielectric layer 23C covers top surfaces and side surfaces of the bottom wiring lines 21B and side surfaces of the bottom contacts 22C, and the bottom dielectric layer 23D covers top surfaces and side surfaces of the bottom wiring lines 21C and top surfaces and side surfaces of the coupling pads 21D. The bottom contacts 22A, 22B and 22C extend in the first direction FD, while the bottom wiring lines 21A and 21C extend in the second direction SD, the bottom wiring lines 21B extend in the Third direction TD. As illustrated in FIG. 5, each of the bottom contacts 22A couples the transistor TR with the bottom wiring line 21A, each of the bottom contacts 22B couples the bottom wiring layer 21A with the bottom wiring line 21B. At least one of bottom contacts 22C couples the bottom wiring line 21B with the bottom wiring lines 21C. At least one of bottom contacts 22C couples the bottom wiring line 21B with the coupling contact 21D. The bottom dielectric layers 23A, 23B, 23C and 23D may include a silicon oxide layer, a silicon nitride layer or a silicon oxynitride layer. While the bottom dielectric layers 23A, 23B, 23C and 23D may include first to fourth bottom dielectric layers 23A, 23B, 23C and 23D, it is to be noted that the embodiment is not limited thereto.

The coupling pads 21D may be disposed on the third bottom dielectric layer 23C. The bottom wiring lines 21A, 21B and 21C may include a first bottom wiring line 21A which is disposed on the first bottom dielectric layer 23A, a second bottom wiring line 21B which is disposed on the second bottom dielectric layer 23B and a third bottom wiring line 21C which is disposed on the third bottom dielectric layer 23C.

Each of the coupling pads 21D may be electrically coupled to a logic transistor TR configuring the page buffer circuit, through a third bottom contact 22C, the second bottom wiring line 21B, a second bottom contact 22B, the first bottom wiring line 21A and a first bottom contact 22A.

The third bottom wiring line 21C may be disposed at the same layer as the coupling pads 21D. The third bottom wiring line 21C may be disposed in the circuit region CR, and may be electrically coupled to a logic transistor TR through the second and first bottom wiring lines 21B and 21A and the third, second and first bottom contacts 22C, 22B and 22A.

The semiconductor layer 31 may be formed on the fourth bottom dielectric layer 23D. The semiconductor layer 31 may include a monocrystalline silicon layer or a polysilicon layer. A well region (not shown) may be formed in the semiconductor layer 31. The well region may be a P-type well which is doped with a P-type impurity. The well region may be an N-type well. The well region may be realized as a P-type well and an N-type well overlapping in the first direction FD.

The semiconductor layer 31 may be disposed in the circuit region CR. The semiconductor layer 31 may not be disposed in the coupling regions PR and the edge regions ER. In other words, the semiconductor layer 31 may expose the fourth bottom dielectric layer 23D in the coupling regions PR and the edge regions ER. The memory blocks MB and the dummy block DB may be disposed on the semiconductor layer 31. The semiconductor layer 31 may have an opening OP which overlaps with the dummy block DB in the first direction FD. The opening OP may pass through the top surface and the bottom surface of the semiconductor layer 31. An isolation dielectric layer IS may be disposed in the opening OP. Hence, the dummy block DB may overlap with the isolation dielectric layer IS in the first direction FD.

The memory blocks MB and the dummy block DB may be arranged along the second direction SD and be disposed to be separated from each other by a predetermined interval.

Each of the memory blocks MB may include a plurality of channel structures CH which extend in the first direction FD from the top surface of the semiconductor layer 31, and a plurality of gate electrode layers 32A and a plurality of first interlayer dielectric layers 32B which are alternately stacked on the semiconductor layer 31 to be positioned around and along the channel structures CH.

The channel structures CH may include a channel layer 33 and a gate dielectric layer 34 which is disposed between the channel layer 33 and the gate electrode layers 32A and first interlayer dielectric layers 32B. The channel layer 33 may include a polysilicon or monocrystalline silicon, and may include a P-type impurity such as boron (B) in some regions. The channel layer 33 may have the shape of a tube in which a center region is open. A buried dielectric layer 35 may be formed in the open center region of the channel layer 33. While not shown, the channel layer 33 may have the shape of a pillar or a solid cylinder which is completely filled up to its center. In this case, the buried dielectric layer 35 may be omitted.

The gate dielectric layer 34 may have the shape of a straw or a cylinder shell which surrounds the outer wall of the channel layer 33. While not shown, the gate dielectric layer 34 may include a tunnel dielectric layer, a charge storage layer and a blocking layer which are sequentially stacked from the outer wall of the channel layer 33. The tunnel dielectric layer may include a silicon oxide, a hafnium oxide, an aluminum oxide, a zirconium oxide or a tantalum oxide. The charge storage layer may include a silicon nitride, a boron nitride, a silicon boron nitride or a polysilicon doped with an impurity. The blocking layer may include a single layer or a stack layer of a silicon oxide, a silicon nitride, a hafnium oxide, an aluminum oxide, a zirconium oxide and a tantalum oxide. In some embodiments, the gate dielectric layer 34 may have an ONO (oxide-nitride-oxide) stack structure in which an oxide layer, a nitride layer and an oxide layer are sequentially stacked.

Among the gate electrode layers 32A, at least one layer from the lowermost gate electrode layer 32A may be used as a source select line, and at least one layer from the uppermost gate electrode layer 32A may be used as a drain select line. The gate electrode layers 32A between the source select line and the drain select line may be used as word lines. Source select transistors may be formed where the source select line surrounds the channel structures CH, memory cells may be formed where the word lines surround the channel structures CH, and drain select transistors may be formed where the drain select line surrounds the channel structures CH. By the above-described structure, a plurality of cell strings each including a source select transistor, memory cells and a drain select transistor which are disposed along each of the channel structures CH may be configured.

Conductive pads 36 may be disposed on the channel structures CH, respectively. The conductive pads 36 may include a silicon material which is doped with an impurity. For example, the conductive pads 36 may include N-type silicon.

The dummy block DB may be disposed in the center portion of the circuit region CR in the second direction SD. While FIGS. 4 and 5 illustrate the case where one dummy block DB is disposed in the center portion of the circuit region CR, it is to be noted that the embodiment is not limited thereto. For example, the dummy block DB may be disposed in a periphery of the circuit region CR, or a plurality of dummy blocks may be provided along the second direction SD in the circuit region CR.

The dummy block DB may include a plurality of dummy gate electrode layers 37A and a plurality of second interlayer dielectric layers 37B which are alternately stacked along the first direction FD. The number of the dummy gate electrode layers 37A which are included in the dummy block DB may be substantially the same as the number of the gate electrode layers 32A which are included in each of the memory blocks MB. The dummy gate electrode layers 37A may be disposed at the same layers as the gate electrode layers 32A, respectively. The gate electrode layer 32A and the dummy gate electrode layer 37A which are positioned at the same layer may be formed at the same processing step. Due to this fact, the thicknesses and materials of the gate electrode layer 32A and the dummy gate electrode layer 37A positioned at the same layer may be the same with each other.

The number of the second interlayer dielectric layers 37B which are included in the dummy block DB may be substantially the same as the number of the first interlayer dielectric layers 32B which are included in each of the memory blocks MB. The second interlayer dielectric layers 37B may be disposed at the same layers as the first interlayer dielectric layers 32B, respectively. The first interlayer dielectric layer 32B and the second interlayer dielectric layer 37B which are positioned at the same layer may be generated at the same processing step. Due to this fact, the heights and materials of the first interlayer dielectric layer 32B and the second interlayer dielectric layer 37B positioned at the same layer may be the same with each other.

A first top dielectric layer 38A may be disposed on the fourth bottom dielectric layer 23D, and may cover the side surfaces and top surfaces of the semiconductor layer 31, the memory blocks MB, the dummy block DB and the conductive pads 36.

Bit lines BL may be disposed on the first top dielectric layer 38A. Bit line contacts BLC which are coupled to the conductive pads 36 through the first top dielectric layer 38A may be disposed under the bit lines BL. The bit lines BL may be electrically coupled to the channel layer 33 of the channel structures CH through the bit line contacts BLC and the conductive pads 36.

The bit lines BL may extend in the second direction SD and be arranged along the third direction TD. Channel structures CH which are disposed in a line along the second direction SD may be coupled in common to a single bit line BL. The bit lines BL may have substantially the same width and be separated from one another by substantially the same distance. For instance, each of the bit lines BL may have a first width W1, and adjacent bit lines BL may be separated by a first separation distance D1. Namely, the bit lines BL may have a first pitch that is defined as the sum of the first width W1 and the first separation distance D1.

The bit lines BL may traverse the circuit region CR and extend onto the coupling regions PR in the second direction SD. Both ends of each of the bit lines BL may be disposed in the coupling regions PR. The bit lines BL may not be disposed in the edge regions ER.

The bit lines BL may be electrically coupled to the logic transistors TR configuring the page buffer circuit, through first coupling contacts 41 and the coupling pads 21D in the coupling regions PR.

In the coupling regions PR, each of the coupling pads 21D may be disposed to overlap with a corresponding bit line BL in the first direction FD.

The first coupling contacts 41 may correspond to the coupling structures 40 shown in FIG. 3. The first coupling contacts 41 may be disposed in the coupling regions PR, and may pass through the first top dielectric layer 38A and the fourth bottom dielectric layer 23D. One end of each first coupling contact 41 may be brought into contact with a corresponding bit line BL, and the other end may be brought into contact with a corresponding coupling pad 21D.

In correspondence to the arrangement structure of the bit lines BL which are repeatedly arranged with a predetermined pitch along the third direction TD, the coupling pads 21D may be repeatedly arranged with a preselected pitch along the third direction TD in the coupling regions PR. In an embodiment, as illustrated in FIG. 4, the coupling pads 21D may be arranged in a zigzag style along the third direction TD in the coupling regions PR.

The bit lines BL may be cut in the third direction TD on the dummy block DB. Each of the cut bit lines BL may be comprised of a first bit line section BLa and a second bit line section BLb which extend in opposite directions when viewed from the dummy block DB in the second direction SD. One end of the first bit line section BLa may overlap with one end of the dummy block DB, and one end of the second bit line section BLb may overlap with the other end of the dummy block DB.

A power pad 50 may be disposed on the first top dielectric layer 38A. The power pad 50 may be disposed at the same layer as the bit lines BL. The power pad 50 may be disposed between the first bit line sections BLa and the second bit line sections BLb of a number of bit lines BL among the cut bit lines BL, which are positioned at a center portion. In an embodiment, as illustrated in FIG. 4, the power pad 50 may be disposed between the first bit line sections BLa and the second bit line sections BLb of four bit lines BL among eight cut bit lines BL, which are positioned at a center portion.

The width of the power pad 50 in the third direction TD may be larger than the width of each bit line BL in the third direction TD. In an embodiment, the power pad 50 may have a width that is defined as the sum of four times the first width W1 and three times the first separation distance D1. While only one power pad 50 is illustrated in the embodiment shown in FIG. 4 for the sake of simplification in illustration, a plurality of power pads may be provided along the third direction TD.

Dummy lines 51 may be disposed on the first top dielectric layer 38A. The dummy lines 51 may be disposed at the same layer as the bit lines BL and the power pad 50. Each dummy line 51 may be disposed between the first bit line section BLa and the second bit line section BLb of each of bit lines BL among the cut bit lines BL, which are positioned at peripheries in the third direction TD. For example, each dummy line 51 may be disposed between the first bit line section BLa and the second bit line section BLb of each of four bit lines BL among the eight cut bit lines BL, which are positioned at both peripheries in the third direction TD. The width of each dummy line 51 may be substantially the same as the width of each bit line BL, and each of the interval between the dummy line 51 and the bit line BL and the interval between the dummy lines 51 may be substantially the same as the interval between the bit lines BL. For example, the width of each dummy line 51 may be substantially the same as the first width W1, and each of the interval between the dummy line 51 and the bit line BL and the interval between the dummy lines 51 may be substantially the same as the first separation distance D1.

Coupling lines 60 corresponding to the cut bit lines BL, respectively, may be disposed on the uppermost second interlayer dielectric layer 37B of the dummy block DB. The coupling lines 60 may extend in the second direction SD. One end of each of the coupling lines 60 may overlap with the first bit line section BLa of a corresponding bit line BL in the first direction FD, and the other end may overlap with the second bit line section BLb of the corresponding bit line BL in the first direction FD.

The width of each coupling line 60 in the third direction TD may be substantially the same as the width of each bit line BL in the third direction TD. The interval between the coupling lines 60 may be substantially the same as the interval between the bit lines BL. In this case, the pitch of the coupling lines 60 may be substantially the same as the pitch of the bit lines BL. The top surfaces and side surfaces of the coupling lines 60 may be covered by the first top dielectric layer 38A.

The power pad 50 may be coupled to the third bottom wiring line 21C of the logic structure 20 through first top contacts 81 and power coupling contacts 70.

The power coupling contacts 70 may be coupled to the third bottom wiring line 21C by passing through the coupling lines 60, the dummy block DB, the isolation dielectric layer IS and the fourth bottom dielectric layer 23D in the first direction FD. In another embodiment, the power coupling contacts 70 may be disposed between the coupling lines 60. In this case, the power coupling contacts 70 may not pass through the coupling lines 60 and may pass through only the dummy block DB, the isolation dielectric layer IS and the fourth bottom dielectric layer 23D.

A sidewall dielectric layer 72 may be disposed between the power coupling contacts 70 and the coupling lines 60 and between the power coupling contacts 70 and the dummy block DB. The sidewall dielectric layer 72 may have the shape of a straw or a cylinder shell which surrounds the outer wall of each power coupling contact 70. The power coupling contacts 70 may be electrically decoupled from the coupling lines 60 and the dummy gate electrode layers 37A of the dummy block DB by the sidewall dielectric layer 72. The first top contacts 81 may couple the power pad 50 and the power coupling contacts 70 through the first top dielectric layer 38A.

Each first bit line section BLa and one end of each coupling line 60 may be electrically coupled with each other through a second top contact 82 which passes through the first top dielectric layer 38A. Each second bit line section BLb and the other end of each coupling line 60 may be electrically coupled with each other through a third top contact 83 which passes through the first top dielectric layer 38A. That is, the first bit line section BLa and the second bit line section BLb of each of the cut bit lines BL may be electrically coupled with each other through the second top contact 82, the coupling line 60 and the third top contact 83.

A second top dielectric layer 38B may be disposed on the first top dielectric layer 38A and cover the side surfaces and top surfaces of the bit lines BL, the power pad 50 and the dummy lines 51. A power line 90 may be disposed on the second top dielectric layer 38B.

The power line 90 may extend in the second direction SD. The power line 90 may be coupled to the power pad 50 through a fourth top contact 84 which passes through the second top dielectric layer 38B. In FIG. 4, the illustration of the power line 90 and the fourth top contact 84 is omitted for the sake of simplification in illustration.

The power line 90 may be coupled to the third bottom wiring line 21C of the logic structure 20 through the fourth top contact 84, the power pad 50, the first top contacts 81 and the power coupling contacts 70. An operating voltage provided to the power line 90 may be transferred to peripheral circuit elements, for example, the logic transistors TR through the fourth top contact 84, the power pad 50, the first top contacts 81, the power coupling contacts 70, the third bottom wiring line 21C, the third bottom contact 22C, the second bottom wiring line 21B, the second bottom contact 22B, the first bottom wiring line 21A and the first bottom contact 22A. The operating voltage may include any one among a power supply voltage, a ground voltage and a source voltage.

Figure 6:
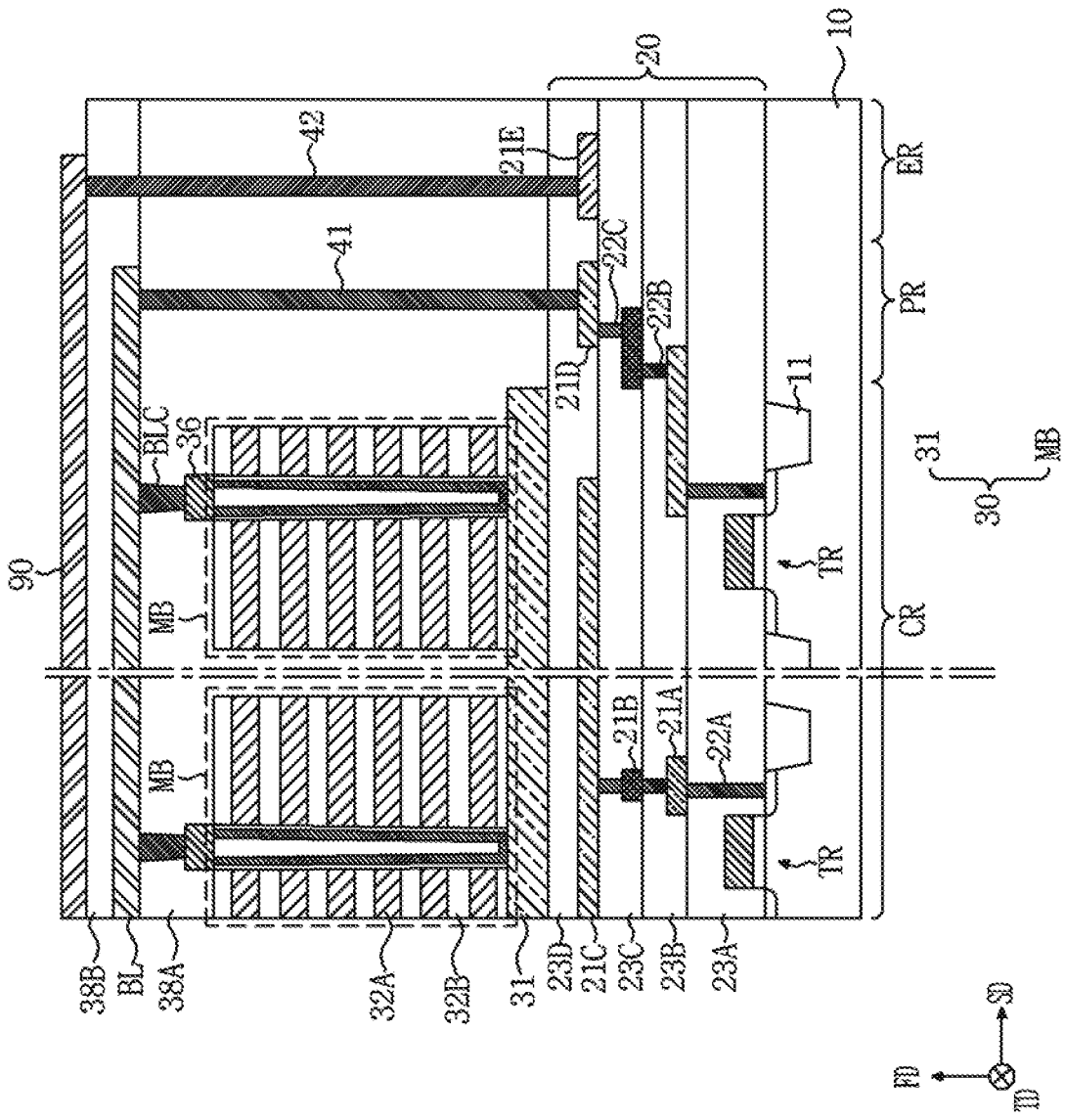
FIG. 6 is a cross-sectional view illustrating a representation of an example of a semiconductor memory device related with the embodiment.

FIG. 6 is a cross-sectional view illustrating a representation of an example of a semiconductor memory device related with the embodiment.

Referring to FIG. 6, bit lines BL may not be cut in a circuit region CR. In this case, since an electrical path which couples a power line 90 and peripheral circuit elements may not be configured in the circuit region CR and a coupling region PR where the bit lines BL are repeatedly disposed, an electrical path which couples the power line 90 and logic transistors TR should be configured in an edge region ER over which the bit lines BL are not disposed.

To this end, the power line 90 should be extended into the edge region ER, a fourth bottom wiring line 21E should be disposed on a third bottom dielectric layer 23C in the edge region ER, and the power line 90 and the fourth bottom wiring line 21E should be electrically coupled through a second coupling contact 42 which passes through second and first top dielectric layers 38B and 38A and a fourth bottom dielectric layer 23D. Further, a wiring line (not shown) which couples the fourth bottom wiring line 21E and a third bottom wiring line 21C should be disposed on the third bottom dielectric layer 23C. The wiring line should traverse the coupling region PR which is disposed between the edge region ER where the fourth bottom wiring line 21E is positioned and the circuit region CR where the third bottom wiring line 21C is positioned. However, because coupling pads 21D are repeatedly arranged in the coupling region PR, it is not easy to dispose the wiring line by avoiding the coupling pads 21D, and for this reason, the number of wiring lines to be disposed cannot help but be limited.

In order to stably provide an operating voltage to the peripheral circuit elements, power transfer paths should be sufficiently secured. In this regard, if the number of wiring lines is limited as described above, the number of power transfer paths may not be secured, and an operating voltage may not be stably provided to the peripheral circuit elements.

According to the present embodiment, the bit lines BL are cut in the circuit region CR, and power transfer paths for transferring an operating voltage to the peripheral circuit elements may be configured through a space that is provided by the cut bit lines BL. Therefore, since the number of power transfer paths may be sufficiently secured by avoiding a spatial limitation due to the presence of the coupling pads 21D, it is possible to stably provide an operating voltage to the peripheral circuit elements.

Figure 7:
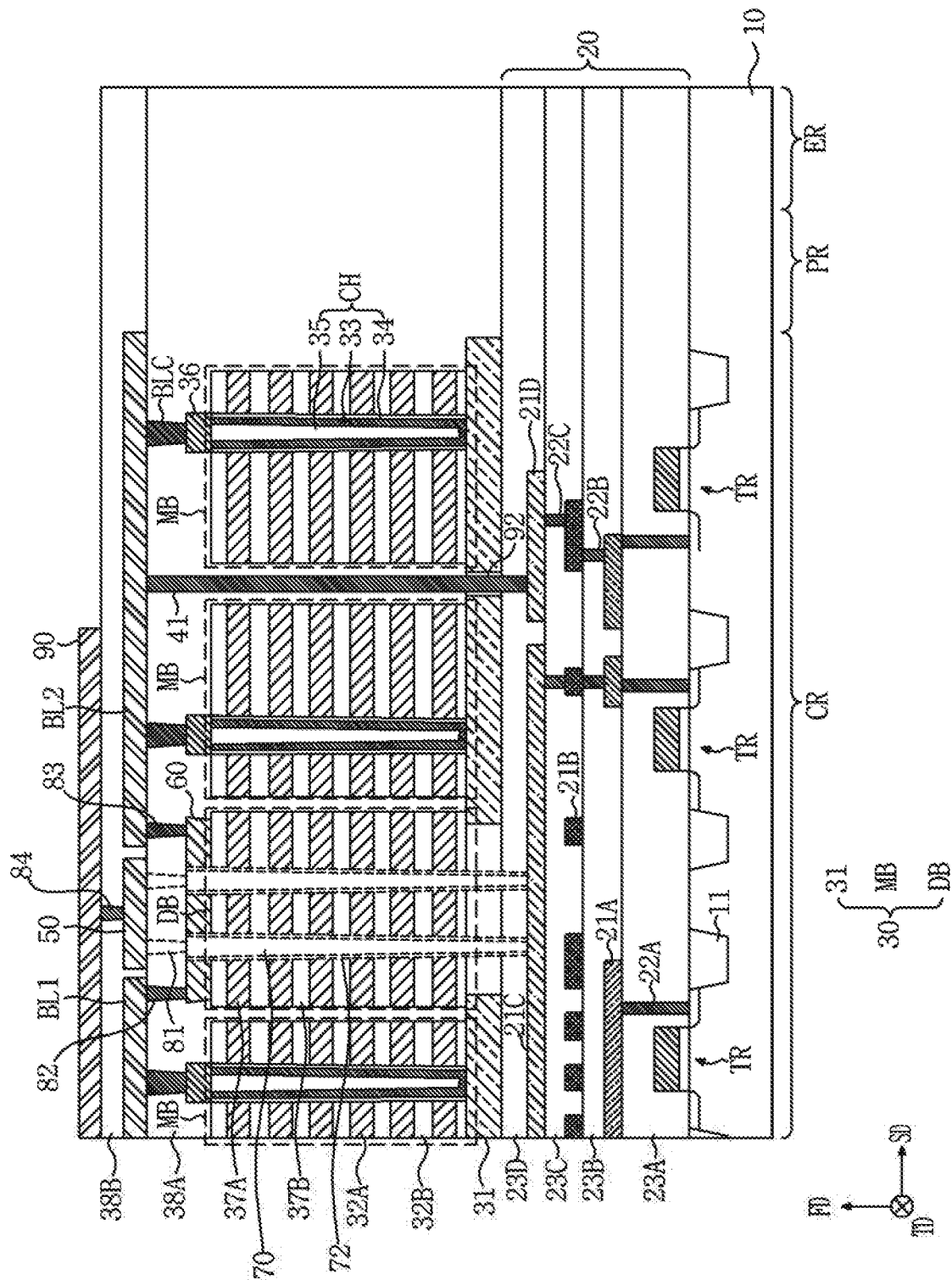
FIG. 7 is a cross-sectional view illustrating a representation of an example of a semiconductor memory device in accordance with an embodiment.

FIG. 7 is a cross-sectional view illustrating a representation of an example of a semiconductor memory device in accordance with an embodiment.

Referring to FIG. 7, the coupling pads 21D and the first coupling contacts 41 are not disposed in the coupling regions PR but in the circuit region CR.

Each of the coupling pads 21D may be disposed to overlap with a corresponding bit line BL in the first direction FD in the circuit region CR. Each of the first coupling contacts 41 may be disposed between memory blocks MB in the circuit region CR, and may pass through a first top dielectric layer 38A, a semiconductor layer 31 and a fourth bottom dielectric layer 23D. A dielectric layer 92 may be formed between the first coupling contact 41 and the semiconductor layer 31, and may electrically isolate the first coupling contact 41 and the semiconductor layer 31.

Figure 8:
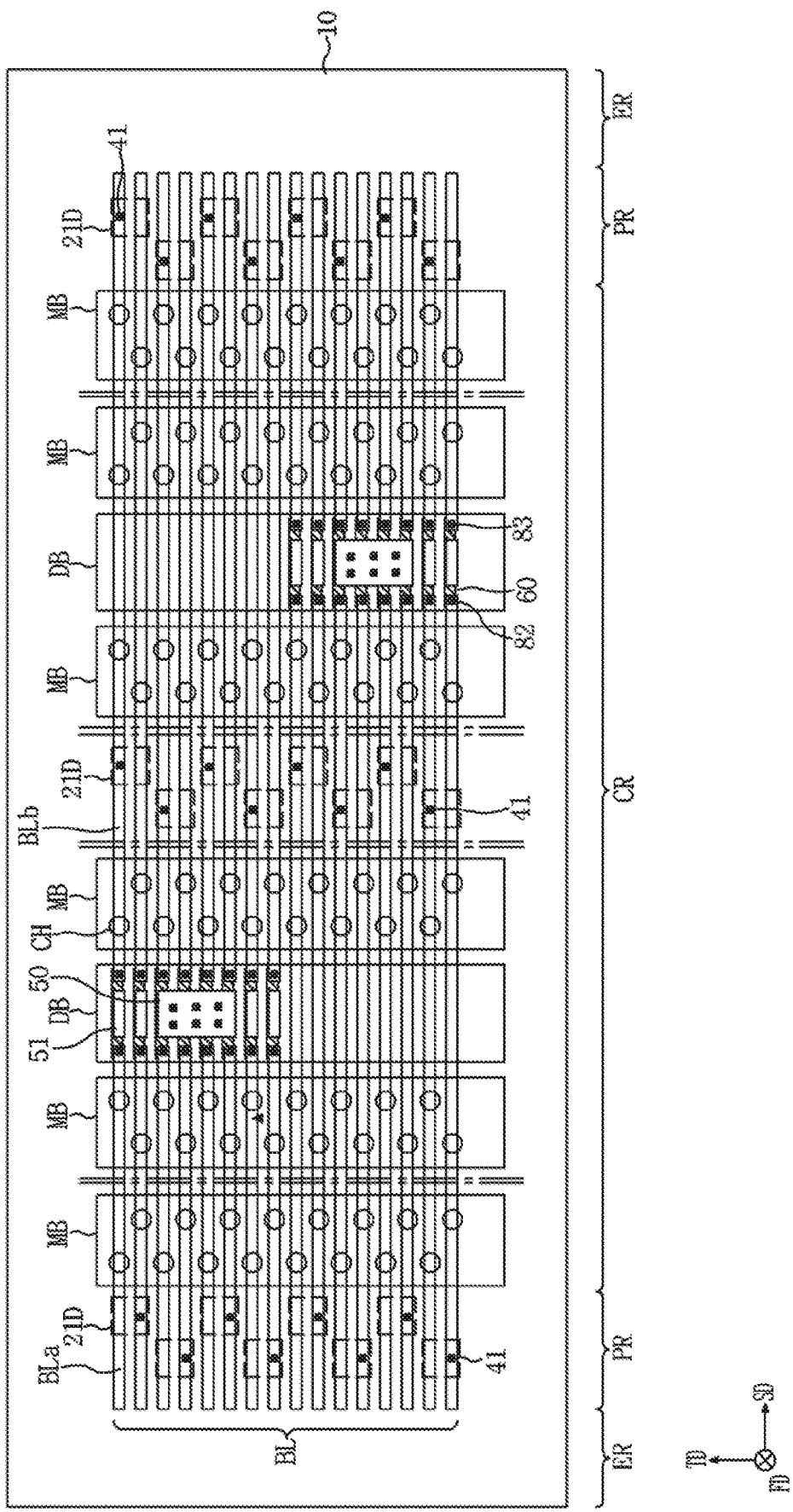
FIG. 8 is a top view illustrating a representation of an example of a semiconductor memory device in accordance with an embodiment.

FIG. 8 is a top view illustrating a representation of an example of a semiconductor memory device in accordance with an embodiment.

Referring to FIG. 8, the coupling pads 21D and the first coupling contacts 41 are disposed both in the coupling regions PR and also in the circuit region CR.

A memory structure may include a plurality of memory blocks MB and a plurality of dummy blocks DB1 and DB2. The memory blocks MB and the dummy blocks DB1 and DB2 may be arranged along the second direction SD. In an embodiment, the dummy blocks DB1 and DB2 may include a first dummy block DB1 and a second dummy block DB2. At least one memory block MB and coupling pads 21D may be disposed between the first dummy block DB1 and the second dummy block DB2.

Each of the bit lines BL may be cut over one corresponding dummy block of the first and second dummy blocks DB1 and DB2. In an embodiment, a number of the bit lines BL may be cut over the first dummy block DB1, and the remainder may be cut over the second dummy block DB2. The bit lines BL which are cut over the first dummy block DB1 may not be cut over the second dummy block DB2. Also, the bit lines BL which are cut over the second dummy block DB2 may not be cut over the first dummy block DB1. A power pad 50 may be disposed in a space that is provided by the bit lines BL cut over the first dummy block DB1. A power pad 50 may be disposed in a space that is provided by the bit lines BL cut over the second dummy block DB2. Due to the fact that the bit lines BL cut over the first dummy block DB1 and the bit lines BL cut over the second dummy block DB2 are different, the power pad 50 disposed over the first dummy block DB1 and the power pad 50 disposed over the second dummy block DB2 may not be disposed in a line in the second direction SD and may be disposed in a zigzag style in the second direction SD.

As aforementioned, each of the cut bit lines BL may include a first bit line section BLa and a second bit line section BLb. The first bit line section BLa and the second bit line section BLb of each of the cut bit lines BL may be electrically coupled with each other through a coupling line 60 (see also FIG. 5), a second top contact 82 (see also FIG. 5) and the third top contact 83 (see also FIG. 5).

Since the cut portions of each of the bit lines BL are coupled through the coupling line 60 and the second and third top contacts 82 and 83, in the case where only partial bit lines BL are cut, differences may be caused in terms of resistance value and capacitance value between bit lines BL which are cut and bit lines BL which are not cut. Due to such differences in resistance value and capacitance value between the bit lines BL, a deviation in RC delay time may occur between the bit lines BL, whereby the electrical characteristic of the semiconductor memory device may degrade.

According to the present embodiment, since each of all bit lines BL is cut over a corresponding dummy block and the cut portions of each bit line BL are coupled through the coupling line 60 and the second and third top contacts 82 and 83, the bit lines BL may have substantially the same resistance value and capacitance value. Therefore, since a deviation in RC delay time does not occur between the bit lines BL, the electrical characteristic of the semiconductor memory device may be improved.

Figure 9:
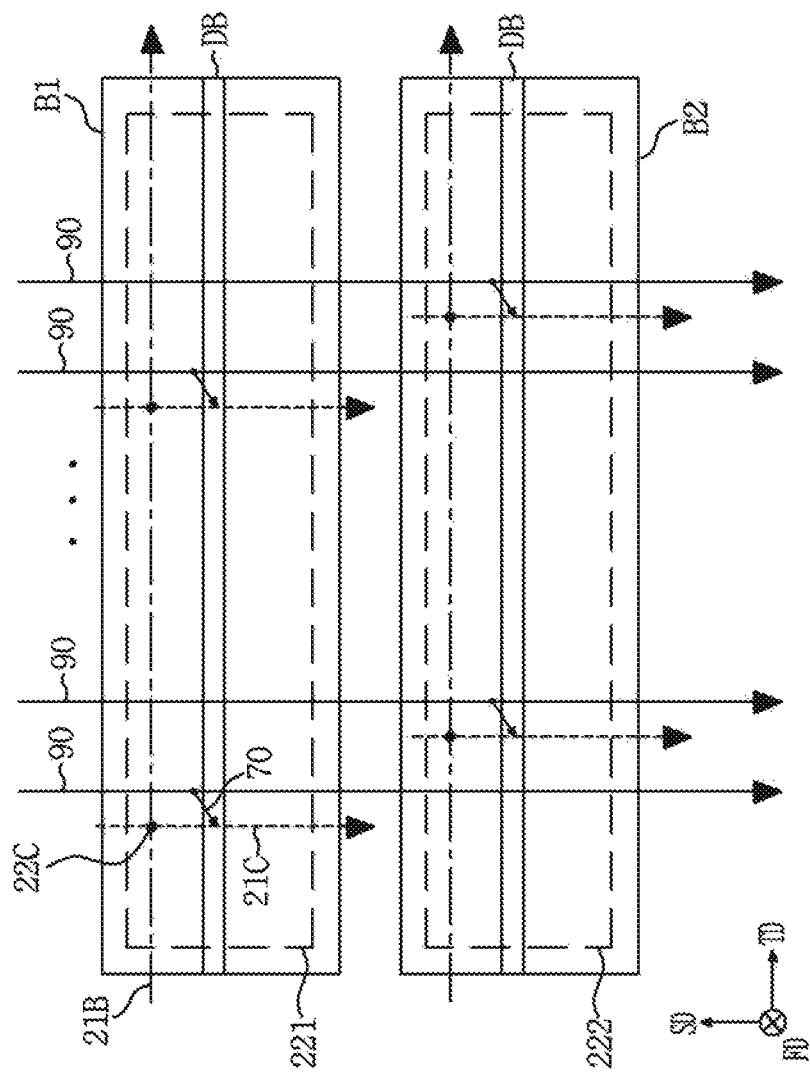
FIGS. 9 and 10 are top views schematically illustrating representations of examples of the layouts of semiconductor memory devices in accordance with embodiments.
Figure 10:
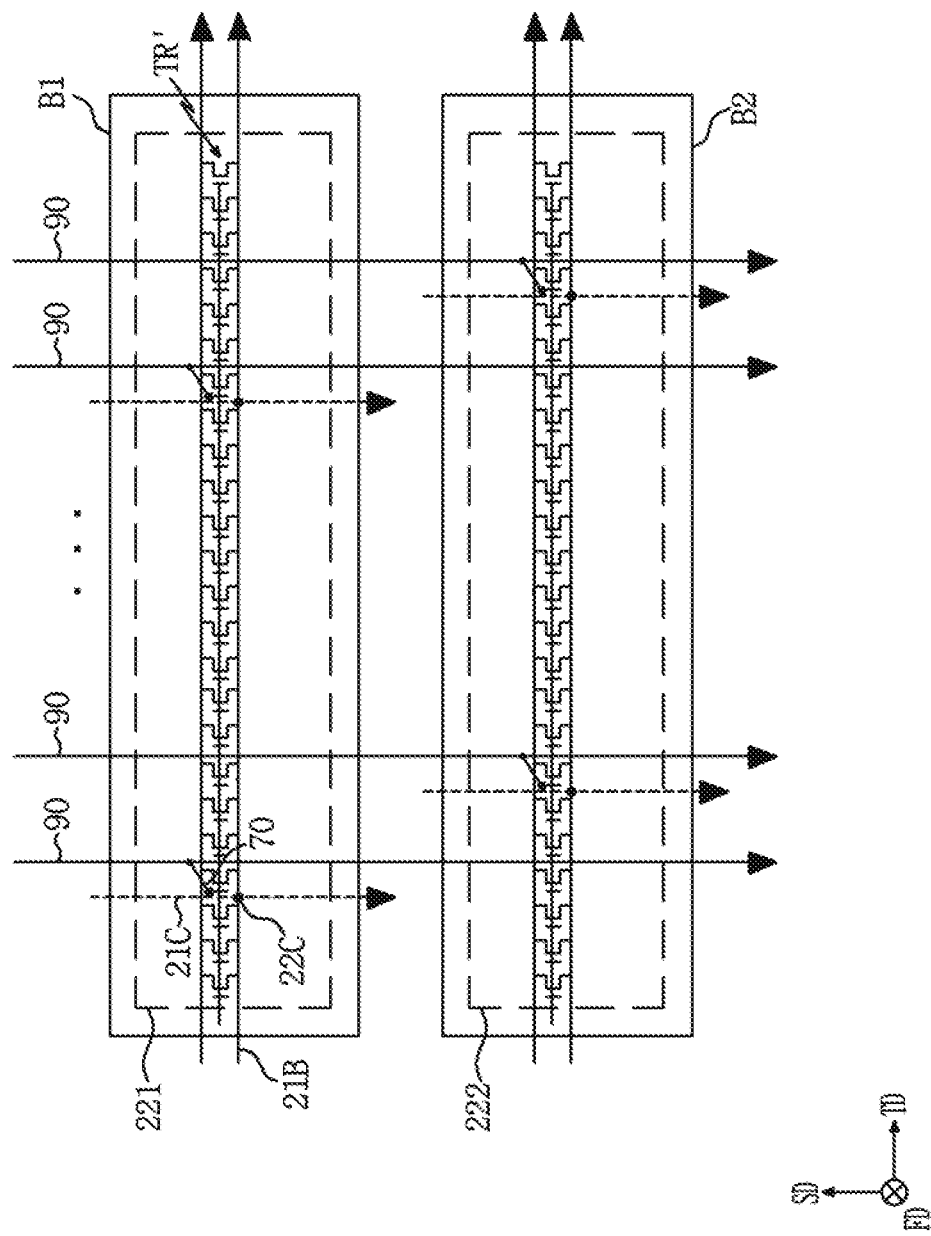

FIGS. 9 and 10 are top views schematically illustrating representations of examples of the layouts of semiconductor memory devices in accordance with embodiments.

Referring to FIG. 9, a memory cell array may include a first memory bank B1 and a second memory bank B2. The memory cell array configured by the first and second memory banks B1 and B2 may be defined as one plane.

A peripheral circuit may be disposed under the memory cell array. The peripheral circuit may include a page buffer circuit. The page buffer circuit may include a first page buffer unit 221 corresponding to the first memory bank B1 and a second page buffer unit 222 corresponding to the second memory bank B2. Each of the first page buffer unit 221 and the second page buffer unit 222 may be disposed to overlap with a corresponding memory bank in the first direction FD.

Power lines 90 which extend in the second direction SD may be disposed over the first and second memory banks B1 and B2. Each of the first and second memory banks B1 and B2 may include a plurality of memory blocks (not shown) and a dummy block DB. The dummy block DB may be disposed in the center portion of each of the first and second memory banks B1 and B2 in the second direction SD. The power lines 90 may be coupled to third bottom wiring lines 21C through power coupling contacts 70 which pass through each dummy block DB. The third bottom wiring lines 21C may extend in the second direction SD. The third bottom wiring lines 21C may be coupled to second bottom wiring lines 21B through third bottom contacts 22C. The second bottom wiring lines 21B may extend in the third direction TD. As described above with reference to FIG. 5, the second bottom wiring lines 21B may be electrically coupled to logic transistors (see TR of FIG. 5) configuring each of the first page buffer unit 221 and the second page buffer unit 222, through second bottom contacts (see 22B of FIG. 5), first bottom wiring lines (see 21A of FIG. 5) and first bottom contacts (see 22A of FIG. 5). By such a structure, the operating voltages provided to the power lines 90 may be transferred to the first and second page buffer units 221 and 222 which are disposed under the first and second memory banks B1 and B2.

Referring to FIG. 10, a peripheral circuit may include a page buffer circuit and source pickup transistors TR'.

The page buffer circuit may include a first page buffer unit 221 corresponding to a first memory bank B1 and a second page buffer unit 222 corresponding to a second memory bank B2. Each of the first page buffer unit 221 and the second page buffer unit 222 may be disposed to overlap with a corresponding memory bank in the first direction FD.

The source pickup transistors TR' may be disposed at the center portion of each of the first and second page buffer units 221 and 222 in the second direction SD. The source pickup transistors TR' may be electrically coupled to a semiconductor layer (see 31 of FIG. 5) through the source terminals thereof, may be electrically coupled to power lines 90 through the drain terminals thereof, and may transfer the voltages provided through the power lines 90 to the semiconductor layer in response to the control signals inputted to the gate terminals thereof.

The power lines 90 which extend in the second direction SD may be disposed over the first and second memory banks B1 and B2. Each of the first and second memory banks B1 and B2 may include a plurality of memory blocks (not shown) and a dummy block (not shown). The dummy block may be disposed in the center portion of each of the first and second memory banks B1 and B2 in the second direction SD. The power lines 90 may be coupled to third bottom wiring lines 21C of a logic structure (see 20 of FIG. 5) through power coupling contacts 70 which pass through each dummy block. The third bottom wiring lines 21C may be coupled to second bottom wiring lines 21B through third bottom contacts 22C. The second bottom wiring lines 21B may extend in the third direction TD. Similarly to the descriptions made above with reference to FIG. 5, the second bottom wiring lines 21B may be electrically coupled to the drain terminals of the source pickup transistors TR', through second bottom contacts (see 22B of FIG. 5), first bottom wiring lines (see 21A of FIG. 5) and first bottom contacts (see 22A of FIG. 5). By such a structure, the operating voltages provided to the power lines 90 may be transferred to the source pickup transistors TR' which are disposed under the first and second memory banks B1 and B2.

According to the embodiments, by cutting bit lines disposed on a memory structure, a power transfer path which couples a power line disposed on the bit lines with peripheral circuit elements included in a logic structure disposed under the memory structure may be constructed through a space defined by the cut bit lines. Therefore, since the number of power transfer paths may be sufficiently secured by avoiding a spatial limitation due to the presence of coupling pads disposed in a bottom wiring layer of the logic structure, it is possible to stably provide operating voltages to the peripheral circuit elements.

Figure 11:
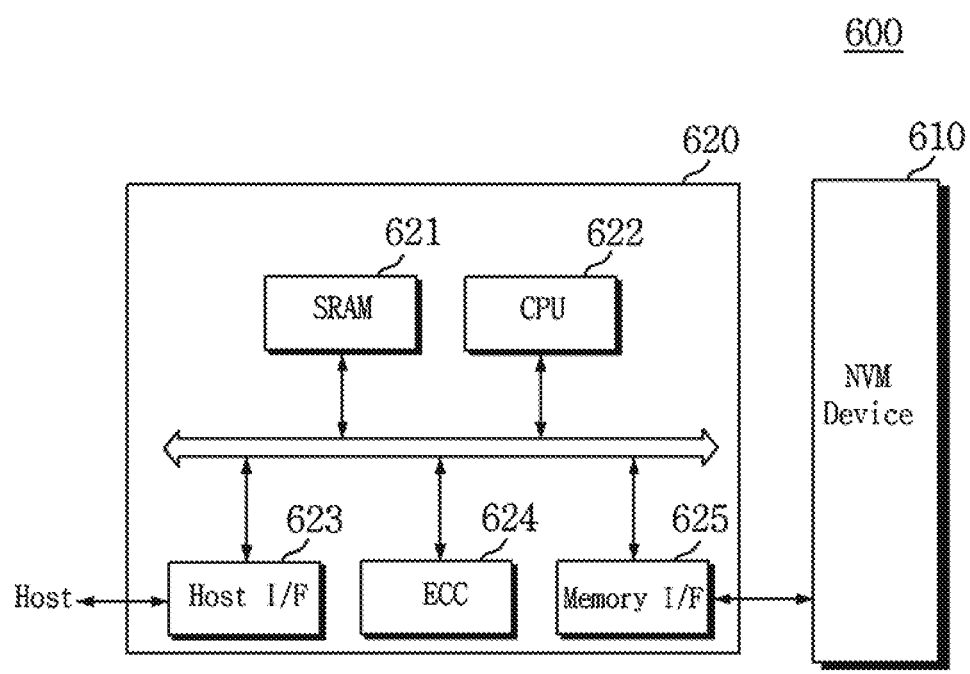
FIG. 11 is a simplified block diagram schematically illustrating a memory system including a semiconductor memory device in accordance with an embodiment.

FIG. 11 is a simplified block diagram schematically illustrating a memory system including a memory device according to an embodiment of the present invention.

Referring to FIG. 11, the memory system 600 may include the semiconductor memory device 610 and a memory controller 620.

The semiconductor memory device 610 may comprise the memory device according to an embodiment of the invention as described above, and may be operated in the manner described above. The memory controller 620 may control the semiconductor memory device 610. For example, the combination of the semiconductor memory device 610 and the memory controller 620, may be configured as a memory card or a solid-state disk (SSD). The memory controller 620 may include an SRAM 621, a central processing unit (CPU) 622, a host interface 623, an ECC block 624, and a memory interface 625.

The SRAM 621 may be used as the working memory of the CPU 622. The host interface 623 may include the data exchange protocol of a host which may be coupled with the memory system 600.

The ECC block 624 may detect and correct an error included in the data read out from the semiconductor memory device 610.

The memory interface 625 may interface with the semiconductor memory device 610. The CPU 622 may perform general control operations for data exchange of the memory controller 620.

Although not shown, it should become apparent to a person skilled in the art that the memory system 600 may further be provided with a ROM which stores code data for interfacing with the host. The semiconductor memory device 610 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid-state disk (SSD). The memory controller 620 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 12:
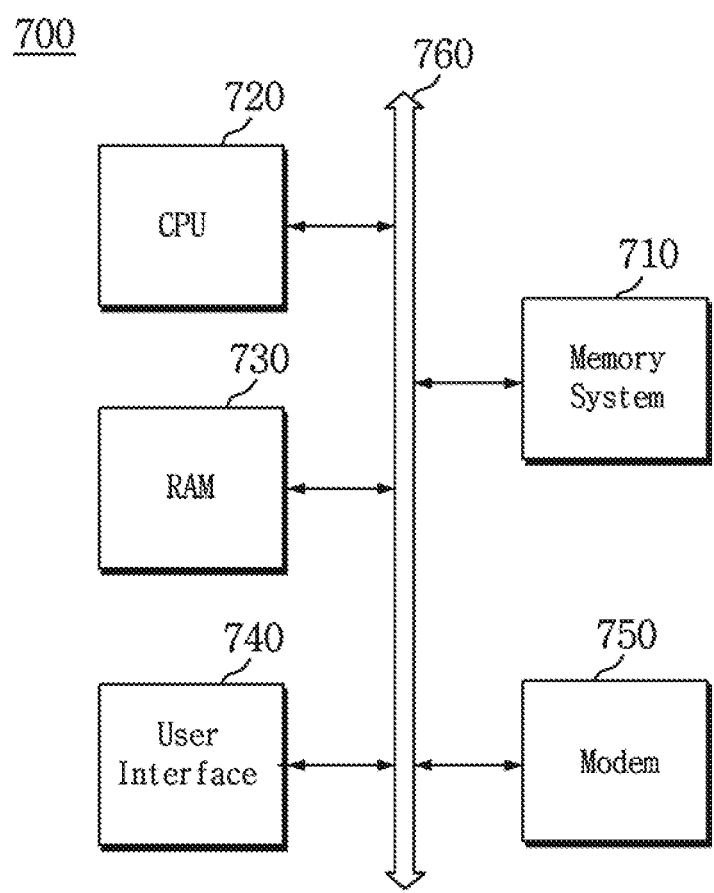
FIG. 12 is a simplified block diagram schematically illustrating a computing system including a semiconductor memory device in accordance with an embodiment.

FIG. 12 is a simplified block diagram schematically illustrating a computing system including a memory device, according to an embodiment of the present invention.

Referring to FIG. 12, a computing system 700 according to an embodiment may include a memory system 710, a microprocessor (or CPU) 720, a RAM 730, a user interface 740, a modem 750 such as a baseband chipset, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a COMS image sensor (CIS), a mobile DRAM, and so on. The memory system 710 may be configured, for example, as an SSD (solid state drive/disk) which uses a nonvolatile memory to store data. Also as an example, the memory system 710 may be provided as a fusion flash memory (for example, a NAND or a NOR flash memory).

It is noted that the above-described embodiments may be realized not only by a device and a method, but may be realized also by a program which performs the function or functions corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
a logic structure including a peripheral circuit element which is formed over a substrate;
a memory structure stacked over the logic structure in a first direction;
a bit line disposed over a first top dielectric layer covering the memory structure, extending in a second direction parallel to the top surface of the substrate, and divided into a first bit line section and a second bit line section, wherein the first bit line section and the second bit line section are disposed along the second direction; and
a power pad disposed over the first top dielectric layer between the first bit line section and the second bit line section, and coupled to the peripheral circuit element, wherein the first bit line section is coupled with the second bit line section through a coupling line.

2. The semiconductor memory device according to claim 1, wherein the logic structure further comprises:
a bottom dielectric layer covering the peripheral circuit element, and
a bottom wiring line disposed in the bottom dielectric layer and coupled to the peripheral circuit element; and
wherein the power pad is coupled to the peripheral circuit element via a power coupling contact which passes through the memory structure to couple the power pad with the bottom wiring line.

3. The semiconductor memory device of claim 2, wherein the memory structure comprises:
a semiconductor layer disposed over the bottom dielectric layer;
a memory block disposed over the semiconductor layer, and including channel structures extending in the first direction and a plurality of gate electrode layers and a plurality of first interlayer dielectric layers alternately stacked over the semiconductor layer to be adjacent to the channel structures; and
a dummy block including a plurality of dummy gate electrode layers and a plurality of second interlayer dielectric layers, which are alternately stacked over the semiconductor layer, and disposed to overlap with the power pad in the first direction, the power coupling contact passing through the dummy block.

4. The semiconductor memory device according to claim 3, further comprising:
a first contact passing through the first top dielectric layer, and having one end which is coupled to the power pad and the other end which is coupled to the power coupling contact.

5. The semiconductor memory device according to claim 3,
wherein the coupling line is disposed over the dummy block, is extending in the second direction, and is covered by the first top dielectric layer;
wherein one end of the coupling line is coupled to the first bit line section by a second contact which passes through the first top dielectric layer, and the other end of the coupling line is coupled to the second bit line section by a third contact which passes through the first top dielectric layer.

6. The semiconductor memory device according to claim 5, wherein the coupling line has the same width as the bit line.

7. The semiconductor memory device according to claim 3, wherein the semiconductor layer has an opening where an isolation dielectric layer through which the power coupling contact passes is accommodated, at a position overlapping with the dummy block in the first direction.

8. The semiconductor memory device according to claim 2, further comprising:
a second top dielectric layer formed over the first top dielectric layer to cover the bit line and the power pad; and
a power line disposed over the second top dielectric layer, and coupled to the power pad through a fourth contact which passes through the second top dielectric layer.

9. A semiconductor memory device comprising:
a logic structure including a peripheral circuit element which is formed over a substrate;
a memory structure stacked over the logic structure in a first direction, and including memory blocks and a dummy block which are arranged in a second direction;
a plurality of bit lines disposed over a first top dielectric layer covering the memory structure, and each including a first bit line section and a second bit line section which extend in opposite directions from both ends of the dummy block when viewed in the second direction;

a plurality of coupling lines each connecting between the first bit line section and the second bit line section; and a power pad disposed over the first top dielectric layer between first bit line sections and second bit line sections of the bit lines, and coupled to the peripheral circuit element.

10. The semiconductor memory device of claim 9, wherein the logic structure further comprises:

a bottom dielectric layer covering the peripheral circuit element, and a bottom wiring line disposed in the bottom dielectric layer and coupled to the peripheral circuit element; and wherein the power pad is coupled to the peripheral circuit element via a power coupling contact which passes through the dummy block to couple the power pad with the bottom wiring line.

11. The semiconductor memory device according to claim 10, wherein the power pad is disposed between first bit line sections and second bit line sections of a number of bit lines which are positioned centrally among the bit lines.

12. The semiconductor memory device according to claim 11, wherein a width of the power pad in a third direction that is parallel to the top surface of the substrate and intersects with the second direction is larger than a width of each bit line.

13. The semiconductor memory device according to claim 11, further comprising:

dummy lines disposed between first bit line sections and second bit line sections of remaining bit lines except for the number of bit lines among the bit lines for which the power pad is disposed between their first and second bit line sections.

14. The semiconductor memory device according to claim 13, wherein a width of each dummy line in the third direction that is parallel to the top surface of the substrate and intersects with the second direction is the same as the width of each bit line.

15. A semiconductor memory device comprising:

a logic structure including a peripheral circuit element which is formed over a substrate;

a semiconductor layer disposed over the logic structure;

a plurality of memory blocks disposed over the semiconductor layer, each including a plurality of channel structures which extend in a first direction that is perpendicular to a top surface of the substrate from the top surface of the semiconductor layer, and a plurality of gate electrode layers and a plurality of first interlayer dielectric layers which are alternately stacked on the semiconductor layer to be positioned around and along the channel structures, and arranged along a second direction that is parallel to the top surface of the substrate;

a plurality of dummy blocks disposed over the semiconductor layer to neighbor the memory blocks in the second direction, and each including a plurality of dummy gate electrode layers and a plurality of second interlayer dielectric layers which are alternately stacked along the first direction;

a plurality of bit lines disposed over a first top dielectric layer which covers the memory blocks and the dummy blocks, extending in the second direction, and each divided into a first bit line section and a second bit line section over a corresponding dummy block among the dummy blocks, wherein the first bit line section and the second bit line section of one of the bit lines are disposed along the second direction; and a plurality of coupling lines each connecting between the first bit line section and the second bit line section of one of the bit lines; and power pads disposed over the first top dielectric layer between first bit line sections and second bit line sections of the bit lines, and coupled to the peripheral circuit element.

16. The semiconductor device of claim 15, further comprising a bottom dielectric layer which covers the peripheral circuit element and a bottom wiring line which is disposed in the bottom dielectric layer and is coupled to the peripheral circuit element, and wherein each power pad is coupled to the peripheral circuit element via a power coupling contact which passes through the dummy block to couple the power pad with the bottom wiring line.

17. The semiconductor memory device according to claim 15, wherein each of the power pads overlaps with any one of the dummy blocks in the first direction.

18. The semiconductor memory device according to claim 17, wherein power pads among the power pads which are disposed to overlap with different dummy blocks are not disposed on the same line in the second direction.

19. The semiconductor memory device according to claim 15, wherein the coupling lines are disposed over the dummy blocks under the first top dielectric layer, extending in the second direction, one ends of the coupling lines are coupled to the first bit line sections of the bit lines by second contacts which pass through the first top dielectric layer; and other ends of the coupling lines are coupled to the second bit line sections of the bit lines by third contacts which pass through the first top dielectric layer.

* * * * *